United States Patent [19]

Gorowitz et al.

[11] Patent Number: 5,524,339
[45] Date of Patent: Jun. 11, 1996

[54] METHOD FOR PROTECTING GALLIUM ARSENIDE MMIC AIR BRIDGE STRUCTURES

[75] Inventors: Bernard Gorowitz, Clifton Park; Richard J. Saia, Schenectady; Kevin M. Durocher, Waterford, all of N.Y.

[73] Assignee: Martin Marietta Corporation, King of Prussia, Pa.

[21] Appl. No.: 308,886

[22] Filed: Sep. 19, 1994

[51] Int. Cl.⁶ ..................................................... H05K 3/30
[52] U.S. Cl. .............................. 29/841; 29/840; 361/795; 437/209
[58] Field of Search ........................... 29/890, 841, 832; 437/209; 361/795

[56] References Cited

U.S. PATENT DOCUMENTS

| | | | |
|---|---|---|---|
| 4,217,684 | 8/1980 | Brisken et al. | 29/840 X |
| 4,631,820 | 12/1986 | Horada et al. | 29/840 |
| 4,725,924 | 2/1988 | Juan | 29/841 X |
| 4,783,695 | 11/1988 | Eichelberger et al. | 357/65 |
| 4,835,704 | 5/1989 | Eichelberger et al. | 364/490 |
| 4,878,991 | 11/1989 | Eichelberger et al. | 156/630 |
| 4,894,115 | 1/1990 | Eichelberger et al. | 156/643 |
| 4,918,811 | 4/1990 | Eichelberger et al. | 437/209 X |
| 4,933,042 | 6/1990 | Eichelberger et al. | 156/239 |
| 5,158,911 | 10/1992 | Quentin | 437/209 |
| 5,161,093 | 11/1992 | Gorczyca et al. | 361/414 |
| 5,255,431 | 10/1993 | Burdick | 29/840 |
| 5,306,670 | 4/1994 | Mowatt et al. | 437/211 X |
| 5,323,533 | 6/1994 | Val | 29/840 |
| 5,324,687 | 6/1994 | Wojnarowski | 437/209 X |
| 5,331,203 | 7/1994 | Wojnarowski et al. | 257/698 |
| 5,338,975 | 8/1994 | Cole, Jr. et al. | 257/750 |
| 5,353,498 | 10/1994 | Fillion et al. | 29/840 |

*Primary Examiner*—Carl J. Arbes
*Attorney, Agent, or Firm*—Geoffrey H. Krauss

[57] ABSTRACT

In a method for preserving an air bridge structure on an integrated circuit chip, a protective layer is plasma-deposited over the top and sides of the air bridge. A high density interconnect structure is applied over the chip and protective layer. The protective film provides mechanical strength during the application of the high density interconnect structure to prevent deformation. It also prevents any contamination from intruding under the air bridge. More importantly, the protective film only negligibly impedes the performance of the air bridge and therefore does not need to be removed, thereby eliminating the necessity of ablating the HDI structure.

11 Claims, 2 Drawing Sheets

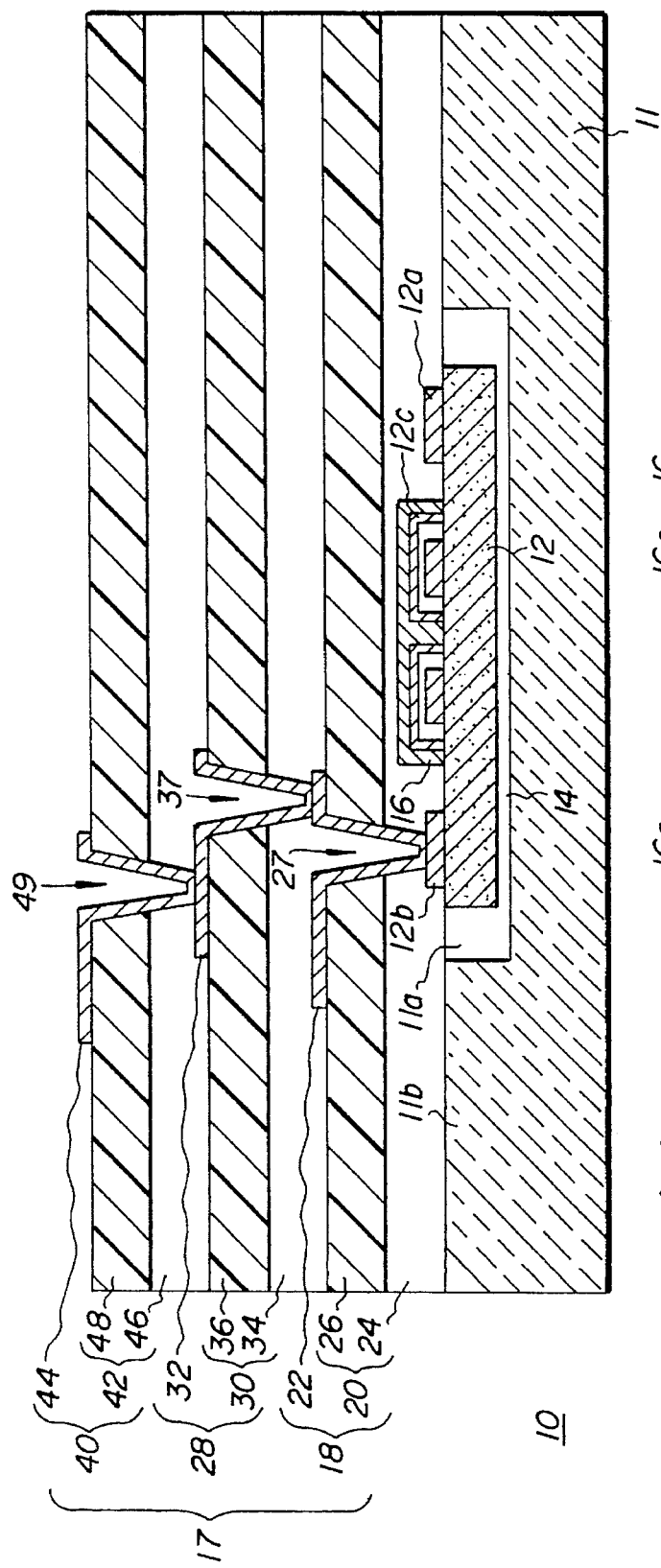
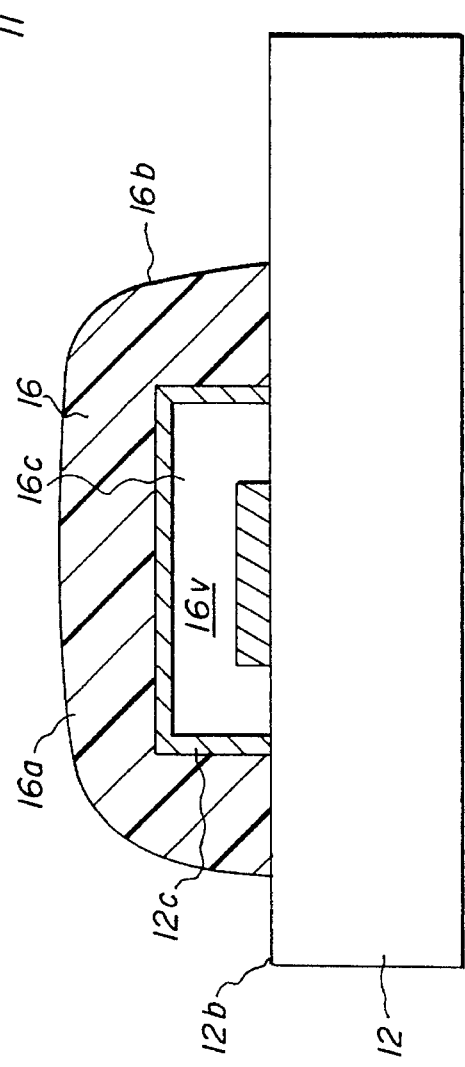
Fig. 1(b)
Fig. 2

METHOD FOR PROTECTING GALLIUM ARSENIDE MMIC AIR BRIDGE STRUCTURES

BACKGROUND OF THE INVENTION

This invention relates generally to integrated circuit packaging incorporating a high density interconnect structure, and more particularly to packaging high speed devices having sensitive structures such as air bridge structures, with a protective material, which after lamination and formation of the high density interconnect structure, may be left in place. This leaves the air bridge protected, and its performance negligibly affected, without requiring removal of modification of the high density interconnect structure.

In the fabrication of certain multi-chip module (MCM) circuits, high performance is accomplished by the use of high speed gallium arsenide (GaAs) devices having delicate structures which can easily be damaged or destroyed during fabrication. These include conductors which are spaced from the surface of the GaAs by an air gap—a structure which is known as an air bridge. Air bridges are used in these circuits to provide improved signal propagation and reduced capacitive coupling over that possible with conventional chip wiring.

The interconnect structure used in the fabrication of high density interconnect (HDI) circuits has many advantages in the compact assembly of MCMs. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as ULTEM® 6000 resin, available from the General Electric Company, Fairfield, Conn.), or an adhesive composition such as is described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film (which may be KAPTON® polyimide, available from E.I. du Pont de Nemours Company, Wilmington, Del.), of a thickness of approximately 0.0005–0.003 inches (approx. 12.5–75 microns), is pretreated by reactive ion etching (RIE) to promote adhesion. The substrate and chips must then be coated with ULTEM® 1000 polyetherimide resin or another thermoplastic adhesive to adhere the KAPTON® resin film when it is laminated across the tops of the chips, any other components and the substrate. Thereafter, via holes are provided (preferably by laser drilling) through the KAPTON® resin film, and ULTEM® resin layers, at locations in alignment with the contact pads on the electronic components to which it is desired to make contact. A multi-sublayer metallization layer, with a first sublayer comprising titanium (approximately 1000 Å) and a second layer comprising copper (approximately 2000 Å), is sputter deposited over the KAPTON® resin layer and extends into the via holes to make electrical contact to the contact pads disposed thereunder. The sputtered copper provides a seed layer for copper electroplating (3 to 4 microns thick). A final layer of titanium (1000 Å) is sputter deposited to complete the Ti/Cu/Ti multilayer metallization. This metallization layer is patterned to form individual conductors using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications listed hereinafter.

This high density interconnect structure provides many advantages. Included among these are the lightest weight and smallest volume packaging of such an electronic system presently available. A further, and possibly more significant, advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This process is straight-forward and fairly rapid with the result that once a desired configuration of the substrate has been established, a corresponding physical substrate can be made ready for the mounting of the semiconductor chips in as little as 1 day and typically 4 hours for small quantities as are suitable for research or prototype systems to confirm the design prior to quantity production.

The high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Haller, et al.; and U.S. Pat. No. 5,108,825, entitled "An Epoxy/Polyimide Copolymer Blend Dielectric and Layered Circuits Incorporating It" by C. W. Eichelberger, et al; U.S. application Ser. No. 07/987,849, entitled "Plasticized Polyetherimide Adhesive Composition and Usage" by Lupinski et al. Each of these Patents and Patent Applications, including the references contained therein, is hereby incorporated in its entirety by reference.

This high density interconnect structure has been developed for use in interconnecting semiconductor chips to form digital systems. That is, for the connection of systems whose operating frequencies are typically less than about 50 MHz, which is low enough that transmission line, other wave impedance matching and dielectric loading effects have not needed to be considered.

The interconnection of structures or devices intended to operate at very high frequencies presents many challenges not faced in the interconnection of digital systems. For example, use of gigahertz frequencies requires consideration of wave characteristics, transmission line effects and material properties. Also, use of high frequencies requires the consideration of the presence of exposed delicate structures on MCMs and other components and system and component characteristics which do not exist at the lower operating frequencies of such digital systems. These considerations include the question of whether the dielectric materials are suitable for use at gigahertz frequencies, since materials which are good dielectrics at lower frequencies can be quite lossy or even conductive at high frequencies. Further, even if the dielectric is not lossy at gigahertz frequencies, its dielectric constant itself may be high enough to unacceptably modify the operating characteristics of MCMs or air bridges.

As stated above, the interconnect structure used in the fabrication of HDI circuits is created from alternating layers of laminated dielectric films and patterned metal films. In the process of laminating the dielectric layers, the adhesive used to bond the dielectric layers is caused to flow and form a quality, void-free interface. There is a substantial concern that air bridges and other sensitive structures may be modified, damaged or destroyed by the lamination pressure. Also, these sensitive structures may be overlay sensitive, i.e., the operating characteristics of the device or component may be different when the device or component is free of interconnection dielectric material than when these devices have high density interconnect dielectric layers disposed over them. Lamination as well as other processing steps may also cause the thermoplastic adhesive to infiltrate the air gap under the conductor, thereby modifying the dielectric properties of that gap.

Since there are sensitive structures present, low temperature processing is needed to ensure that these structures are not damaged during multi-chip module fabrication. For example, chips of certain semiconductors (GaAs, InSb and HgCdTe), as well as the structures on these chips, e.g., air bridges, are very sensitive to processing in high temperature regimes. Multichip modules incorporating a high density interconnect structure, as well as sensitive structures, must be fabricated at temperatures below about 260° C.

To maintain the performance advantage of having air, or some other electrical insulator, as the dielectric medium, the MCM fabrication process must be designed to provide a means of preserving these air bridge structures from intrusion by other materials.

For example, related application Ser. No. 07/869,090 filed on Apr. 14, 1992, by W. P. Kornrumpf et al., and entitled, "High Density Interconnected Microwave Circuit Assembly" teaches removing the high density interconnect dielectric from portions of the chip which are overlay sensitive. That is, after the HDI structure is laminated, the portion of the HDI structure overlying the sensitive structure is removed by ablation. Removing the HDI structure improves the performance of the sensitive structure, e.g., air bridge, because there is no overlying material. However, ablating the overlying material does not prevent adhesive from flowing under the bridge during processing; nor does it prevent the lamination pressure from occasionally damaging or even collapsing the air bridge. As will be discussed hereinbelow, removing the HDI structure over the sensitive structure also decreases the area available for routing the electrical conductors within the HDI structure and severely restricts the potential usefulness of the HDI technique. This patent application, including the references contained therein, is hereby incorporated in its entirety by reference.

Related U.S. Pat. No. 5,331,203, filed Apr. 5, 1990, by Wojnarowski et al., and entitled "A High Density Interconnect Structure Including a Chamber" teaches bonding the chip containing a sensitive structure into a deep chip-well. Since the chip-well is deeper than the chip is thick, there is a space created over the surface of the chip. A first dielectric layer is laminated such that this layer is only attached to a plateau portion of the substrate and to the upper surface of the chip. This first dielectric layer is not applied over the sensitive structure. Then, the remainder of the HDI structure is laminated, thereby creating a "chamber" of air over the sensitive structure. If successfully laminated, this technique creates a space over the sensitive structure to allow it to work properly. However, in practice this lamination procedure is very difficult to reproduce without damaging the sensitive structure. Because the second dielectric layer has adhesive, it is still difficult to produce a module where the adhesive from this layer does not infiltrate the space under the air bridge. Furthermore, because the chip is in a deep chip-well it is difficult to make electrical contact with the chip pads through the via holes with the metallization layer within the high density interconnect structure. This patent application, including the references contained therein, is hereby incorporated in its entirety by reference.

Related application Ser. No. 07/546,965, filed Jul. 2, 1990, by Cole et al, and entitled "High Density Interconnection Including a Spacer and a Gap", teaches applying spacers over the contact pads present on the integrated circuit chips, and then stretching the first HDI dielectric layer over these spacers such that the dielectric layer does not contact the chip surface. This application provides a method of fabricating a HDI module incorporating a sensitive chip structure without the dielectric layer of the high density interconnect structure inhibiting the chip's performance. However, since the adhesive from the first dielectric layer is designed to flow and form a void free layer, it may contaminate any sensitive structure which is placed between the spacers. Also, because the high density interconnect structure is supported only by the spacers, there may be difficulties with the dielectric layers sagging and causing interruptions in the metallization layers. This patent application, including the references contained therein, is hereby incorporated in its entirety by reference.

Related application Ser. No. 08/046,299, entitled "High Density Interconnection of Substrates and Integrated Circuit Chips containing Sensitive Structures", to Cole et al. teaches laying down a solvent soluble layer to "protect" the air bridge during lamination of the HDI structure. Once the module is fully worked-up, the HDI structure which overlays the sensitive structure is ablated away and the module is immersed in a solvent to remove the protective layer. This method, although very labor intensive, inhibits damage to the air bridge and prohibits the adhesive from getting under the bridge during lamination of the high density interconnect structure. This patent application, including the references contained therein, is hereby incorporated in its entirety by reference.

Unfortunately, the teaching disclosed in the last-mentioned application suffers from the disadvantage that the need to exclude the high density interconnect structure from the surface of overlay-sensitive components severely restricts the surface area available for the routing of the high density interconnect structure metallization layers since they cannot be routed over the area from which the dielectric layer is to be removed. Where chips are closely packed for maximum density, this essentially limits the high density interconnect structure to the routing of conductors in the "streets" and "avenues" portion of the structure which extends from the contact pads of one chip to the contact pads of the adjacent chip. For systems where high density of interconnect conductors is required, such a restriction can require excessive numbers of layers of interconnect conductors, require that the chips be spaced further apart than would otherwise be necessary, or even make a system unroutable.

Consequently, an improved method for protecting sensitive structures which does not disrupt the routing of the metallization layers within the high density interconnect structure, is desirable.

OBJECTS OF THE INVENTION

Accordingly, a primary object of the invention is to provide multi-chip modules fabricated with air bridges in a manner which does not require removal of any portion of an overlying high density interconnect structure.

SUMMARY OF THE INVENTION

Briefly, according to the invention, a method for preserving an air bridge structure on an integrated circuit chip having chip pads, includes the step of applying a protective carbon film over the air bridge. The protective film can be applied solely to the air bridge, or applied to the entire substrate surface with the material then removed at areas other than those over the air bridge. A high density interconnect structure is applied over the chip and substrate with metallization layers interconnected to the chip pads. The protective film provides mechanical strength during the application of the high density interconnect structure to prevent deformation, and also prevents contaminants from intruding under the air bridge. More importantly, the protective film negligibly impedes the performance of the air bridge and therefore does not need to be removed, thereby eliminating the necessity of removing or modifying the HDI structure.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

FIG. 1(a)–(b) are cross-sectional views of a multi-chip module at various progressive stages of a procedure for using a protective layer to provide mechanical support for an air bridge structure in micro-electronic circuitry;

FIG. 2 is a cross-sectional view of a chip with an air bridge structure encased with a protective layer to provide mechanical support during processing.

DETAILED DESCRIPTION

Figure 1A:
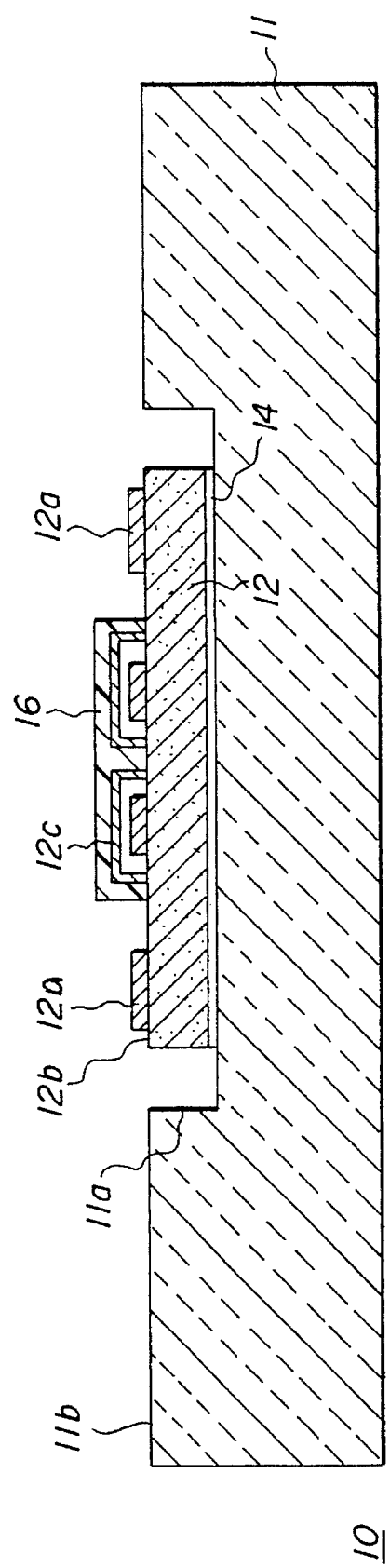

Referring initially to FIG. 1(a), a multichip module 10 has a substrate 11 with a plurality of chip cavities 11a formed therein, through a top surface 11b thereof. An integrated circuit chip 12 or another electronic component is disposed in each chipwell 11a. Electronic components 12 may be bonded to the substrate 11 with a layer of a thermoplastic adhesive 14; these electronic components 12 have contact pads 12a on an upper contact surface 12b thereof. These electronic components 12 also have sensitive structures, such as air bridges 12c, on upper surface 12b.

In accordance with the invention, a protective layer 16 is applied over and around the sensitive structure 12c creating an encapsulating volume 16v, as shown in FIG. 2. This encapsulating volume 16v includes the area comprising the protective layer 16 as defined by a top surface 16a, walls 16b and a bottom 12b, as well as the area 16c underneath the air bridge which is essentially devoid of protective layer 16. This encapsulation volume 16v has (1) a lower surface defined by the substrate surface plane, or the chip surface 12b, (2) an upper surface 16a spaced a distance above said sensitive structure (approximately less than 2 to 3 times the sensitive structure's height which is about 2 to about 3 microns), and (3) walls 16b which generally extend from the lower surface to the upper surface. The walls 16b may have a cut (not shown) made by the mask used during deposition. This protective layer 16 creates a protective "shield" structure covering the sensitive structure from the top and sides. The protective layer 16 may be applied by masking the entire surface of the substrate surface 11b except the sensitive structure 12c, such that the protective layer 16 is only applied to the sensitive structure 12c. Alternatively, the entire substrate surface 11b may be coated with the protective layer 16 and then the protective layer 16 can be removed everywhere except over the sensitive structure 12c.

The protective layer 16 is generally comprised of a carbon film which is a dielectric, and preferably is a plasma-decomposed, amorphous hydrogenated carbon byproduct of a simple hydrocarbon having 1 to 5 carbons. A simple hydrocarbon should be understood to mean any material that has a boiling point below 100° C. Any commercially available hydrocarbons that become volatile below this temperature may be used, e.g., methane, propane, etc., aldehydes, alcohols, or others. A preferable hydrocarbon is butanone. This amorphous carbon film 16 is preferably from about 4 to about 6 microns thick.

The protective layer 16 is produced by allowing a hydrocarbon, such as butanone liquid, to volatilize into a chamber of a reactive ion etcher/deposition system, while maintaining a reduced pressure sufficient to ignite and sustain a uniform discharge. Adhesion, density and other film characteristics may be adjusted by varying the deposition conditions. For example, a preferred method for depositing the amorphous carbon film involves a three step process. The first layer is a thin layer of dense/hard carbon for improved adhesion to the sensitive substrate and chip surface. The second layer is a thick layer of bulk amorphous carbon, followed by another layer of dense/hard carbon for maximum protection. Changing the density and thickness of the films is done by adjustment of the time and pressure settings within the deposition apparatus.

In cases where the bond strength of the carbon to the chip surface needs improvement, a primer layer of known plasma-deposited adhesion-promoter materials may be applied. A preferred material is silicon nitride. The thickness of this primer layer may range from 300 to 1000 angstroms. This adhesion-promoter layer also must not detrimentally affect the performance characteristics of the air bridge structure in any significant manner.

Since the deposition process of either the primer layer or the dielectric protective film is line-of-sight, they will not significantly intrude under the air bridge, and therefore will not significantly affect the performance characteristics of the air bridge. However, even if the amorphous carbon film does intrude under the air bridge to the same extent as its thickness, the film's dielectric constant is such that it should not significantly interfere with the functioning of the air bridge.

The final structure of a high density interconnect structure 17 fabricated above the chips 12 (and the sensitive structures 12c) on the substrate upper surface 11b is shown in FIG. 1(b). A first stratum 18 of the overlying high density interconnect structure 17 comprises a dielectric layer 20 supporting a patterned metallization layer 22. The dielectric layer 20 has separate lower and upper sublayers 24 and 26, respectively, and supports the patterned metallization layer 22 which makes electrical contact with contact pads 12b on the substrate 11 within via holes 27 in the dielectric layer 20. The lower dielectric sublayer 24 is a thermoplastic adhesive which allows subsequent processing at temperatures below 260° C.

As referenced hereinabove, U.S. application Ser. No. 07/987,849, teaches a plasticized polyetherimide adhesive, such as "Ultem"/"Benzoflex" (Ultem is a trademark of General Electric Co, Pittsfield, Mass., for a polyetherimide resin, and Benzoflex is a trademark of Velsicol Chemical Corp., Rosemont, Ill., for pentaerythritol tetrabenzoate). The upper dielectric sublayer 26 is preferably a thermoset material (for example, a KAPTON® film). Other materials, including thermoplastics which exhibit sufficient stability, may also be used for the upper dielectric sublayer 26.

A second stratum 28 of the high density interconnect structure comprises a second dielectric layer 30 supporting a second patterned metallization layer 32. The dielectric layer 30 has separate lower and upper sublayers 34 and 36, respectively. The second lower sublayer 34 may be a siloxane polyimide/epoxy (SPIE) adhesive system as described in commonly assigned U.S. Pat. No. 5,161,093, issued Nov. 3, 1992, to Gorczyca et al, which is herein incorporated by reference in its entirety. Since this second dielectric layer is a SPIE thermosetting copolymer, and therefore changes its glass transition temperature value upon curing, laminating multiple layers (at 190° C.) does not affect lower layers. Via holes 37 are drilled and another patterned metallization sublayer 32 extends into via holes 37 in the dielectric layer 30 to make electrical contact with the first metallization layer 22. If desired, selected via holes may extend through the first dielectric layer 20 as well to provide direct electrical contact to selected contact pads 12a.

The third stratum 40 of the high density interconnect structure comprises a third dielectric layer 42 supporting a third patterned metallization layer 44. The dielectric layer 42 has separate lower and upper sublayers 46 and 48, respectively. The third lower dielectric sublayer is preferably a siloxane polyimide/epoxy (SPIE) adhesive. The third stratum also comprises a third patterned metallization layer 44. The third upper dielectric sublayer 48 may again be a thermoset material or a thermoplastic material and is preferably a thermoset material, i.e.,KAPTON® film. Lamination of this third stratum 40 is followed by via drilling which extends vias 49 through the stratum 40 such that the patterned metallization layer 44 will make electrical contact to the metal layer 32 of the second dielectric layer 28. Because of the laser drilling of via holes, the dielectric layers of the high density interconnect structure 17 of the present invention must be laser ablatable or should be rendered laser ablatable in accordance with U.S. patent application Ser. No. 456,421, entitled, "Laser Ablatable Polymer Dielectrics and Methods," herein incorporated by reference in its entirety.

Additional (fourth, fifth, sixth, etc.) strata of the high density interconnect structure 17 are not shown in FIG. 1(b), but, if used, will be essentially identical to the lower strata 28 and 40. Each additional upper stratum would comprise a dielectric layer having a thermosetting adhesive (preferably a SPIE blend) and having via holes therein, and a patterned metallization layer making electrical contact with the patterned metallization of the next lower patterned metallization layer through the via holes. Other strata can be added in accordance with the above description.

In this structure, the SPIE crosslinking copolymer blend adhesive materials used as the lower dielectric sublayer in the second and higher strata are selected so that these adhesive materials become set at a low enough temperature that curing the adhesive materials has no adverse effect on the high density interconnect structure or the electronic components being connected thereby. Correct selection of the curing properties of the adhesive materials allows the structure to be fabricated and, if need be, disassembled and reassembled without an adverse effect on the electronic components being interconnected.

Since the protective material 16 need not be removed from below the high density interconnect structure, there is no need to use any form of removal process for HDI structure 17 to expose layer 16; thus, neither chemical etch nor laser ablation of the high density interconnect structure 17 is necessary. More importantly, there are no limitations placed on the routing of the metallization layers and the air bridge structure is not exposed to any of the conventional high density interconnect structure removal processes, such as laser ablation and plasma-ashing. This is a significant advantage in producing a highly reliable module.

However, since air has even better dielectric properties than hydrogenated amorphous carbon, improved chip performance could theoretically be achieved if the protective layer 16 is removed at the end of the HDI process. To this end, another advantage of this system is that the amorphous carbon is easily removed. One method of removing the protective material 16 is by laser ablation and oxygen plasma, leaving a clean, damage-free air bridge 12c.

At this point the fabricated module may be complete; various metallization layers 22, 32, 44 will carry power, ground, and at least one set of signal conductors. And since none of the high density interconnect structure is removed, there are few limitations on how the metallization layers must be routed.

EXAMPLE

The following illustrative example is not intended to limit the scope of this invention but to illustrate its application and use:

EXAMPLE

A GaAs chip containing air bridges was attached to a substrate using a thermoplastic adhesive. The entire assembly was then cleaned by soaking the part for 5 minutes each in methylene chloride, acetone and propanol. The part was then vacuum baked at 250° C. for 30 minutes and plasma cleaned in a barrel etcher using oxygen (150 W, 110° C., 30 min.). After this cleaning procedure, 600 Å of plasma enhanced chemical vapor deposited (PECVD) silicon nitride layer (adhesion promoter) was conformably coated over the chip surface. The protective amorphous carbon structure was then deposited, using a three-step process, in a parallel plate reactive ion etching system using 2-butanone as the hydrocarbon source.

The first layer in the three layer process is a 500 Å of hard diamond like carbon (30 mtorr, 50 W, 250 Å /min.). The second layer was 4 microns of soft amorphous hydrogenated carbon (500 mtorr, 50 W, 450 Å/min.). The third layer is identical to the first layer (30 mtorr, 50 W, 250 Å/min.). The completed protective film, comprising the three sublayers was then patterned and removed from the test pads using laser ablation and plasma etching. The entire assembly was then laminated at 260° C. with a dielectric containing two sublayers. The lower sublayer was a thermoplastic adhesive, such as "Ultem"/"Benzoflex" adhesive. The upper sublayer of the dielectric was "Kapton® polyimide. After lamination the dielectric was laser ablated to expose the test probe pads.

The GaAs chip was then retested for electrical performance. The mean RF performance loss recorded at 3 to 6 GHz was within the measurement error of the test. This indicated that the air bridge structures were not damaged by the lamination process, and the presence of the protective layer did not significantly change the chip performance.

While the invention has been described in detail herein in accordance with certain preferred embodiments thereof, many modifications and changes therein may be effected by those skilled in the art. Accordingly, it is our intent to be limited only by the scope of the appending claims and not by way of the details and instrumentalities describing the embodiments shown herein.

What is claimed is:

1. A method for making an electronics module, comprising the steps of:

(1) disposing a plurality of electronic chips on a substrate surface, at least some of the chips including contact pads, and at least one of the chips including a sensitive structure;

(2) encasing the sensitive structure within a protective layer which does not impede the performance of the sensitive structure and encases the sensitive structure from a top and sides, thereby protecting the sensitive structure from damage and processing contamination; and (3) applying at least one stratum of a high density interconnect structure, comprising the steps of:
 (a) applying a dielectric film layer over the chips and the substrate surface;
 (b) providing a plurality of via openings in the dielectric film, the openings being disposed over at least some of the contact pads; and
 (c) providing a pattern of electrical conductors on the film so that the conductors extend between the via openings so as to electrically connect selected contact pads.

2. The method for making an electronics module according to claim 1, wherein the sensitive structure is an air bridge and the method is carried out at a temperature between about 240° C. and 260° C.

3. The method for making an electronics module according to claim 2, wherein a primer layer is deposited over the sensitive structure prior to encasing the sensitive structure within the protective layer.

4. The method for making an electronics module according to claim 3, wherein the primer layer is silicon nitride 5. The method for making an electronics module according to claim 2, wherein the protective layer is a plasma-deposited, amorphous and hydrogenated carbon layer.

6. The method for making an electronics module according to claim 5, wherein the protective layer is a simple hydrocarbon having 1 to 5 carbons.

7. The method for making an electronics module according to claim 6, wherein the simple hydrocarbon has a boiling point below about 100° C.

8. The method for making an electronics module according to claim 6, wherein the simple hydrocarbon is 2-butanone.

9. The method of claim 2, wherein the step of removing the protective layer leaves the sensitive structure essentially free of processing contamination.

10. The method of claim 1, wherein the high density interconnect structure is removed from over the sensitive structure by large area ablation and the protective layer is removed from over the sensitive structure.

11. The module formed by the method of claim 1, wherein the area under the sensitive structure is substantially devoid of the protective layer.

* * * * *